(12) United States Patent
Nagimov (10) Patent No.: US 12,557,243 B2
(45) Date of Patent: Feb. 17, 2026

(54) SYSTEMS AND METHODS FOR MAGNETIC PUMPING IN THERMAL MANAGEMENT DEVICES

(71) Applicant: Microsoft Technology Licensing, LLC, Redmond, WA (US)

(72) Inventor: Ruslan Nagimov, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 232 days.

(21) Appl. No.: 18/201,018

(22) Filed: May 23, 2023

(65) Prior Publication Data
US 2024/0397663 A1      Nov. 28, 2024

(51) Int. Cl.
*H05K 7/20* (2006.01)

(52) U.S. Cl.
CPC ..... *H05K 7/20272* (2013.01); *H05K 7/20236* (2013.01); *H05K 7/20263* (2013.01); *H05K 7/203* (2013.01); *H05K 7/20327* (2013.01)

(58) Field of Classification Search
CPC ............... H05K 7/203; H05K 7/20327; H05K 7/20263; H05K 7/20236; H05K 7/20272
USPC ........................................................ 165/80.4
See application file for complete search history.

(56) References Cited

U.S. PATENT DOCUMENTS

| | | | | |
|---|---|---|---|---|
| 6,600,649 B1 * | 7/2003 | Tsai | ................ | H01L 23/473 174/15.1 |
| 7,509,999 B2 * | 3/2009 | Angelis | ............ | F04D 25/0613 361/699 |
| 7,582,997 B2 * | 9/2009 | Rojo Lulic | ........... | F04D 13/027 310/104 |
| 7,672,129 B1 * | 3/2010 | Ouyang | ................ | H01L 23/473 174/15.1 |
| 7,738,250 B2 * | 6/2010 | Wu | ....................... | H01L 23/473 165/80.4 |
| 7,780,422 B2 * | 8/2010 | Berroth | ................. | F04D 13/026 417/423.5 |
| 7,921,903 B2 * | 4/2011 | Hertweck | ............... | G06F 1/20 165/80.4 |
| 8,118,083 B2 * | 2/2012 | Utsunomiya | ........... | G06F 1/203 165/104.31 |
| 9,332,672 B2 * | 5/2016 | Horng | ................ | H05K 7/20154 |

(Continued)

FOREIGN PATENT DOCUMENTS

WO      2012120093 A1      9/2012

OTHER PUBLICATIONS

International Search Report and Written Opinion received for PCT Application No. PCT/US2024/030144, Jul. 30, 2024, 12 pages.

(Continued)

*Primary Examiner* — Claire E Rojohn, III
(74) *Attorney, Agent, or Firm* — Ray Quinney & Nebeker P.C.; Paul N. Taylor (57) ABSTRACT

A device may include a thermal interface configured to receive heat from a heat-generating electronic component. A device may include an electrically conductive working fluid in contact with the thermal interface to receive heat from the thermal interface. A device may include a magnetic pump configured to apply a magnetic field and an electrical current to the electrically conductive working fluid. A device may include a heat exchanger in thermal communication with the electrically conductive working fluid to exhaust heat from the electrically conductive working fluid.

15 Claims, 9 Drawing Sheets

(56) References Cited

U.S. PATENT DOCUMENTS

| | | | | |
|---|---|---|---|---|
| 9,795,058 B2* | 10/2017 | Tsai | ................... | H05K 7/20272 |
| 9,803,937 B2* | 10/2017 | Franz | ................... | H01L 23/473 |
| 9,901,007 B1* | 2/2018 | Reynov | ............. | H05K 7/20309 |
| 9,947,853 B2* | 4/2018 | Riel | ....................... | H10N 10/17 |
| 9,976,812 B2* | 5/2018 | Holahan | ............... | F04D 29/586 |
| 10,091,909 B2* | 10/2018 | Brunschwiler | ....... | H01L 23/473 |
| 10,111,366 B2* | 10/2018 | Fan | ................... | H05K 7/20736 |
| 10,123,464 B2* | 11/2018 | Moore | ............... | H05K 7/20818 |
| 10,330,395 B2* | 6/2019 | Franz | ................ | H05K 7/20254 |
| 10,527,365 B1* | 1/2020 | Schlottig | ............ | H05K 7/20327 |
| 10,684,661 B1* | 6/2020 | Thakar | ...................... | G06F 1/20 |
| 10,746,084 B2* | 8/2020 | Sabate | ................... | F01P 7/044 |
| 10,874,034 B1* | 12/2020 | Chen | ................... | H01L 23/473 |
| 10,943,850 B2* | 3/2021 | Ganti | .................. | H05K 7/2039 |
| 11,069,595 B2* | 7/2021 | Lan | ................... | H05K 7/20772 |
| 11,220,739 B2* | 1/2022 | Zoestbergen | ........ | C23C 14/246 |
| 11,432,433 B2* | 8/2022 | Yalamarthy | ........... | F04D 25/166 |
| 11,805,626 B1* | 10/2023 | Weems | ............. | H05K 7/20827 |
| 11,882,671 B2* | 1/2024 | Chiu | ................. | H05K 7/20772 |
| 12,193,192 B2* | 1/2025 | Ganti | ............... | H05K 7/20509 |
| 2007/0235180 A1* | 10/2007 | Ouyang | ............... | H01L 23/473 |
| | | | | 165/287 |
| 2007/0240849 A1* | 10/2007 | Lin | ....................... | H01L 23/427 |
| | | | | 165/80.4 |
| 2008/0174962 A1* | 7/2008 | Belady | ..................... | G06F 1/20 |
| | | | | 361/699 |
| 2010/0124022 A1* | 5/2010 | Causevic | ................ | G06F 1/203 |
| | | | | 361/689 |
| 2018/0341298 A1* | 11/2018 | Cheng | ................ | H05K 7/20318 |
| 2019/0364699 A1* | 11/2019 | Gao | .................... | H05K 7/20254 |
| 2020/0323100 A1* | 10/2020 | Chiu | ...................... | H05K 7/208 |
| 2021/0307198 A1* | 9/2021 | Chen | ................. | H05K 7/20272 |
| 2022/0045592 A1* | 2/2022 | Huang | ................. | G06F 1/1615 |
| 2023/0055907 A1* | 2/2023 | Chen | .................... | H01L 23/473 |
| 2023/0301036 A1* | 9/2023 | Gregory | .................. | G06F 1/203 |
| | | | | 361/679.53 |
| 2023/0345673 A1* | 10/2023 | Trieu | ..................... | H05K 7/203 |
| 2023/0403821 A1* | 12/2023 | Oruganti | ............ | H05K 7/20818 |
| 2024/0107716 A1* | 3/2024 | Nasr Azadani | .... | H05K 7/20318 |
| 2024/0198330 A1* | 6/2024 | Nagimov | ........... | B01L 3/502715 |
| 2024/0206116 A1* | 6/2024 | Nagimov | .............. | B81B 7/0093 |
| 2024/0314917 A1* | 9/2024 | Nagimov | ........... | H05K 7/20372 |
| 2024/0397663 A1* | 11/2024 | Nagimov | ........... | H05K 7/20272 |
| 2025/0035346 A1* | 1/2025 | Nagimov | ........... | H05K 7/20263 |

OTHER PUBLICATIONS

"Magnetohydrodynamic converter", Retrieved from: https://en.wikipedia.org/w/index.php?title=Magnetohydrodynamic_converter&action=history, Jan. 29, 2023, 3 Pages.

Ito, et al., "Influences of Channel Size and Operating Conditions on Fluid Behavior in a MHD Micro Pump for Micro Total Analysis System", In Journal of International Council on Electrical Engineering, vol. 4, No. 3, Jul. 1, 2014, pp. 220-226.

* cited by examiner

SYSTEMS AND METHODS FOR MAGNETIC PUMPING IN THERMAL MANAGEMENT DEVICES

BACKGROUND

Electronic devices, such as computing devices, generate heat during operation. High performance computing devices can require high thermal management capacities to prevent damage to components of the computing device.

BRIEF SUMMARY

In some aspects, the techniques described herein relate to a system for thermal management, the system including: a thermal interface configured to receive heat from a heat-generating electronic component; an electrically conductive working fluid in contact with the thermal interface to receive heat from the thermal interface; a magnetic pump configured to apply a magnetic field and an electrical current to the electrically conductive working fluid; and a heat exchanger in thermal communication with the electrically conductive working fluid to exhaust heat from the electrically conductive working fluid.

In some aspects, the techniques described herein relate to a method of thermal management, the method including: receiving heat in an electrically conductive working fluid via a thermal interface; applying an electrical current to the electrically conductive working fluid with a magnetic pump in a pumping region; generating a magnetic field in the electrically conductive working fluid induced by applied electrical current in the pumping region; generating a resultant force on the electrically conductive working fluid in response to the induced magnetic field interacting with a magnetic field of external permanent magnet or electromagnet; moving the electrically conductive working fluid through a conduit; and exhausting at least a portion of the heat from the electrically conductive working fluid.

In some aspects, the techniques described herein relate to a system for thermal management, the system including: a thermal interface configured to receive heat from a heat-generating electronic component; an electrically conductive working fluid in contact with the thermal interface to receive heat from the thermal interface; a magnetic pump configured to apply a magnetic field to the electrically conductive working fluid and an electrical current in the electrically conductive working fluid; a heat exchanger to exhaust heat from the electrically conductive working fluid to an immersion cooling fluid; and a fluid conduit providing fluid communication for the electrically conductive working fluid from the thermal interface to the heat exchanger.

This Summary is provided to introduce a selection of concepts in a simplified form that are further described below in the Detailed Description. This Summary is not intended to identify key features or essential features of the claimed subject matter. Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 is a perspective view of a thermal management device, according to at least some embodiments of the present disclosure.

FIG. 2-2 is a bottom perspective view of the thermal management device of FIG. 2-1, according to at least some embodiments of the present disclosure.

FIG. 2-3 is a cross-sectional view of the thermal management device of FIG. 2-1, according to at least some embodiments of the present disclosure.

FIG. 2-4 is a cross-sectional view of the thermal management device of FIG. 2-1 coupled to a computing device, according to at least some embodiments of the present disclosure.

DETAILED DESCRIPTION

The present disclosure relates generally to the thermal management of heat-generating components. More particularly, the present disclosure relates to the thermal management of heat-generating components with a magnetohydrodynamic pumping mechanism. In some embodiments, a thermal management device includes an electrically conductive working fluid that receives heat from a heat-generating component through a thermal interface and a magnetic pump urges the electrically conductive working fluid away from the thermal interface. In some embodiments, the electrically conductive working fluid flows through a conduit away from the thermal interface to exhaust at least a portion of the heat. In some embodiments, the electrically conductive working fluid flows through a closed-loop conduit away from the thermal interface to exhaust at least a portion of the heat before returning to the thermal interface to receive heat again. In some embodiments, the electrically conductive working fluid flows through a closed-loop conduit away from the thermal interface to exhaust at least a portion of the heat at a heat exchanger before returning to the thermal interface to receive heat again.

In some embodiments, the magnetic pump includes a magnet and a pair of electrodes. The pair of electrodes are in electrical communication with a portion of the electrically conductive working fluid to induce an electrical current through the electrically conductive working fluid between the first electrode and the second electrode of the pair of electrodes. In some embodiments, an external magnetic field in the electrically conductive working fluid is induced by the magnet of the magnet pump. The flow of electrical current between the first electrode and the second electrode in the presence of an external magnetic field generates a resultant Lorentz force perpendicular to both the direction of the magnetic field and the direction of the electrical current. The resultant force urges the portion of the electrically conductive working fluid with the electrical current therein to flow in the direction of the resultant force away from the magnetic pump. In some embodiments, the resultant force urges a hot electrically conductive working fluid to flow away from a thermal interface. In some embodiments, the resultant force urges a cool electrically conductive working fluid to flow toward a thermal interface. In some embodiments, the resultant force urges the electrically conductive working fluid to flow through a conduit of the thermal management device.

A thermal management device including a magnetic pump, according to some embodiments of the present disclosure, includes a sealed conduit or volume in which the electrically conductive working fluid flows. A sealed conduit or volume has substantially continuous inner surface with no seals, bearings, openings, or gaps during operation that can allow for ingress of contaminants or egress of the electrically conductive working fluid during operation. For example, a sealed conduit may have a removable cap or opening that allows the conduit or volume to be filled with electrically conductive working fluid, but the cap or opening remains closed during operation. Because there is no mechanical pumping of the electrically conductive working fluid, no shaft, arm, lever, or other mechanical linkage need pass through the inner surface of the conduit or volume and potentially allow for failure of a seal. The operational lifetime of a thermal management device, according to some embodiments of the present disclosure, may be longer than that of a mechanically pumped working fluid.

Figure 1:
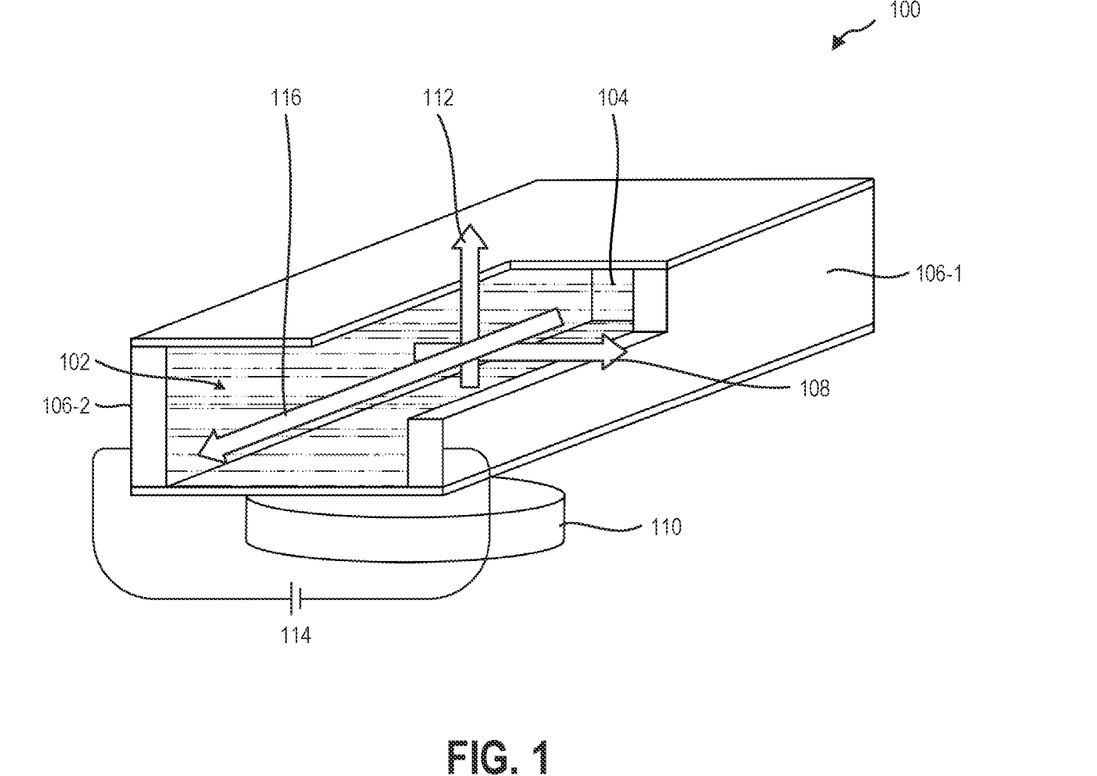
FIG. 1 is a partial cutaway view of a magnetic pump, according to at least some embodiments of the present disclosure.

FIG. 1 is a perspective schematic view of a magnetic pump 100 used in a thermal management device according to some embodiments of the present disclosure. The magnetic pump 100, in some embodiments, includes a pumping region 102 in which an electrically conductive working fluid 104 is positioned. A first electrode 106-1 and a second electrode 106-2 are positioned on opposite sides of the pumping region 102. The first electrode 106-1 and the second electrode 106-2, when an electrical potential is applied thereto, generate an electrical current 108 through the electrically conductive working fluid 104 positioned in the pumping region 102 between the electrodes 106-1, 106-2.

In some embodiments, the magnetic pump 100 includes a magnet 110 positioned proximate to the pumping region 102 and oriented to apply a magnetic field 112 to the pumping region 102. In some embodiments, the magnet 110 is positioned proximate to the pumping region 102 and oriented to apply a magnetic field 112 with a magnetic flux substantially perpendicular to the direction of the electrical current 108. In some embodiments, the magnet 110 is positioned proximate to the pumping region 102 and oriented to apply a component of the magnetic flux perpendicular to the direction of the electrical current 108.

In some embodiments, the magnet 110 of the magnetic pump 100 is a permanent magnet. In some embodiments, the magnet 110 of the magnetic pump 100 is an electromagnet. In some embodiments, the magnet 110 of the magnetic pump 100 includes both a permanent magnet and an electromagnet. In some embodiments, the magnet 110 of the magnetic pump 100 includes a plurality of magnets, such as a plurality of permanent magnets, a plurality of electromagnets, or a combination of at least one permanent magnet and at least one electromagnet. In some embodiments, electromagnets are cooled passively or using an external cooling system. In some embodiments, electromagnets are cooled using the working fluid from within the magnetic pump.

The electrodes 106-1, 106-2 are connected to a voltage or current source 114 to provide an electrical voltage or electrical current across the pumping region 102 between the first electrode 106-1 and the second electrode 106-2. In at least one embodiment, the voltage or current source 114 provides a variable electrical voltage and/or current to the pair of electrodes 106-1, 106-2 to vary the magnitude of the electrical current 108 induced in the electrically conductive working fluid 104 in the pumping region. In some embodiments, the voltage or current source 114 is further connected to the magnet(s) 110 of the magnetic pump 100 to provide an electrical current to an electromagnet.

The electrically conductive working fluid 104 in the pumping region 102 allows the electrical current 108 to flow between the first electrode 106-1 and the second electrode 106-2. In some embodiments, the electrically conductive working fluid 104 has a resistivity of no greater than $10^{-6}$ Ohm×m.

In some embodiments, the electrically conductive working fluid 104 is or includes a metal phase that is liquid at the operating temperatures of the thermal management device. For example, the electrically conductive working fluid 104 has a melting temperature no more than 30° C. In some embodiments, the electrically conductive working fluid 104 has a melting temperature no more than 10° C. In some embodiments, the electrically conductive working fluid 104 has a melting temperature of no more than 0° C.

In some embodiments, the electrically conductive working fluid 104 is or includes gallium, such as elemental gallium or alloys including gallium. In at least one embodiment, the electrically conductive working fluid 104 is or includes gallium indium tin (known as Galinstan). In some examples, gallium indium tin has a melting temperature of approximately −2° C. In some examples, eutectic composition of gallium indium tin has a melting temperature of approximately 11° C. In some embodiments, the electrically conductive working fluid 104 is or includes mercury, such as elemental mercury or alloys including mercury. In some embodiments, mercury has a melting temperature of approximately −39° C.

While some embodiments include a metal fluid, in some embodiments, the electrically conductive working fluid 104 is a non-metal fluid. For example, the electrically conductive working fluid 104 may include a non-metal fluid with ions allowing the non-metal fluid to conduct electricity. In some embodiments, the electrically conductive working fluid 104 is or includes a liquid electrolyte. In some embodiments, the electrically conductive working fluid 104 is or includes water with ions and/or electrolytes in solution in the water. In some embodiments, the electrically conductive working fluid 104 is or includes an ionized gas.

In some embodiments, the electrically conductive working fluid 104 is substantially uniform, such as a liquid metal electrically conductive working fluid, an electrolytic aqueous electrically conductive working fluid, or an ionized gas electrically conductive working fluid. In some embodiments, the electrically conductive working fluid 104 is a multi-phase working fluid including a liquid phase and a particulate phase in suspension in the liquid phase. In some embodiments, the particulate phase is electrically conductive and allows the electrical current to flow through the electrically conductive working fluid 104 by flowing through the particulate phase. In an example, the electrically conductive working fluid 104 includes iron or electrically conductive iron alloy particles in a particulate phase suspended in a non-electrically conductive oil liquid phase (e.g., ferrofluid). In some embodiments, the liquid phase is electrically conductive. In an example, the electrically conductive working fluid 104 includes non-electrically conductive particles in a particulate phase suspended in an electrically conductive liquid phase. The particulate phase may have a higher thermal capacity and/or thermal mass than the liquid phase, allowing the electrically conductive working fluid 104 to receive more heat, while the electrically conductive liquid phase conducts the electrical current. In some embodiments, both the particulate phase and the liquid phase are electrically conductive. In an example, the electrically conductive working fluid 104 includes iron or electrically conductive iron alloy particles in a particulate phase suspended in a non-electrically conductive oil liquid phase.

In some embodiments, the electrically conductive working fluid 104 is a single physical phase working fluid. In such embodiments, the electrically conductive working fluid 104 remains in a liquid phase throughout the operation of the thermal management device. In some embodiments, the electrically conductive working fluid 104 is a two physical phase working fluid. In such embodiments, at least a portion of the electrically conductive working fluid 104 vaporizes and condenses during operation of the thermal management device.

The flow of electrical current 108 between the first electrode 106-1 and the second electrode 106-2 in the presence of a magnetic field 112 generates a resultant force 116 perpendicular to both the direction of the magnetic field 112 and the direction of the electrical current 108. The resultant force 116 urges the portion of the electrically conductive working fluid 104 with the electrical current 108 therein to flow in the direction of the resultant force 116 away from the magnetic pump 100.

Figure 21:
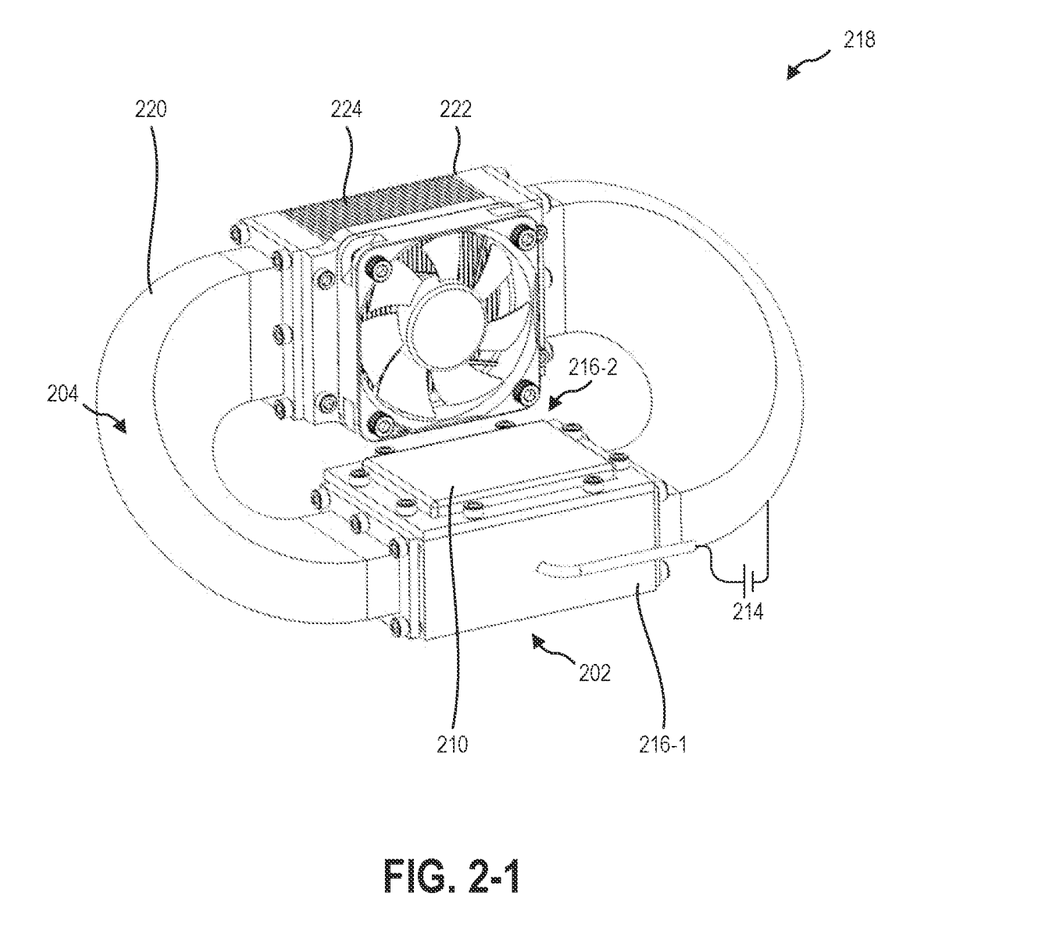

FIG. 2-1 is a perspective view of a thermal management device according to some embodiments of the present disclosure. In some embodiments, a thermal management device 218 includes a magnetic pump 200, such as any of the embodiments described in relation to FIG. 1 and/or any other elements of magnetic pumps described herein. In some embodiments, the magnetic pump 200 is in fluid communication with a fluid conduit 220 that flows the electrically conductive working fluid 204 away from the magnetic pump 200 and/or toward the magnetic pump. In some embodiments, the fluid conduit 220 is a sealed fluid conduit. A sealed conduit or volume has substantially continuous inner surface with no seals, bearings, openings, or gaps during operation that can allow for ingress of contaminants or egress of the electrically conductive working fluid during operation. For example, a sealed conduit may have a removable cap or opening that allows the conduit or volume to be filled with electrically conductive working fluid, but the cap or opening remains closed during operation. In some embodiments, the fluid conduit 220 is an unsealed fluid conduit.

In some embodiments, the fluid conduit 220 flows the electrically conductive working fluid 204 from the magnetic pump 200 to a heat exchanger 222. The heat exchanger 222 exhausts heat from the electrically conductive working fluid 204. In an example, the heat exchanger 222 has a plurality of fins 224, rods, pins, etc., to increase surface area of the heat exchanger 222 and exhaust heat received from the electrically conductive working fluid 204. In some embodiments, the electrically conductive working fluid 204 exhausts heat to the surrounding atmosphere. In some embodiments, as will describe in more detail herein, the electrically conductive working fluid 204 exhausts heat to an immersion working fluid.

In some embodiments, the magnetic pump 200 is in electrical communication with a voltage or current source 214, such as described in relation to FIG. 1. In some embodiments, the voltage or current source 214 provides electrical power to the electrodes 216-1, 261-2 of the magnetic pump 200. In some embodiments, the voltage or current source 214 provides electrical power to a magnet 210 (e.g., an electromagnet) of the magnetic pump 200.

Figure 22:
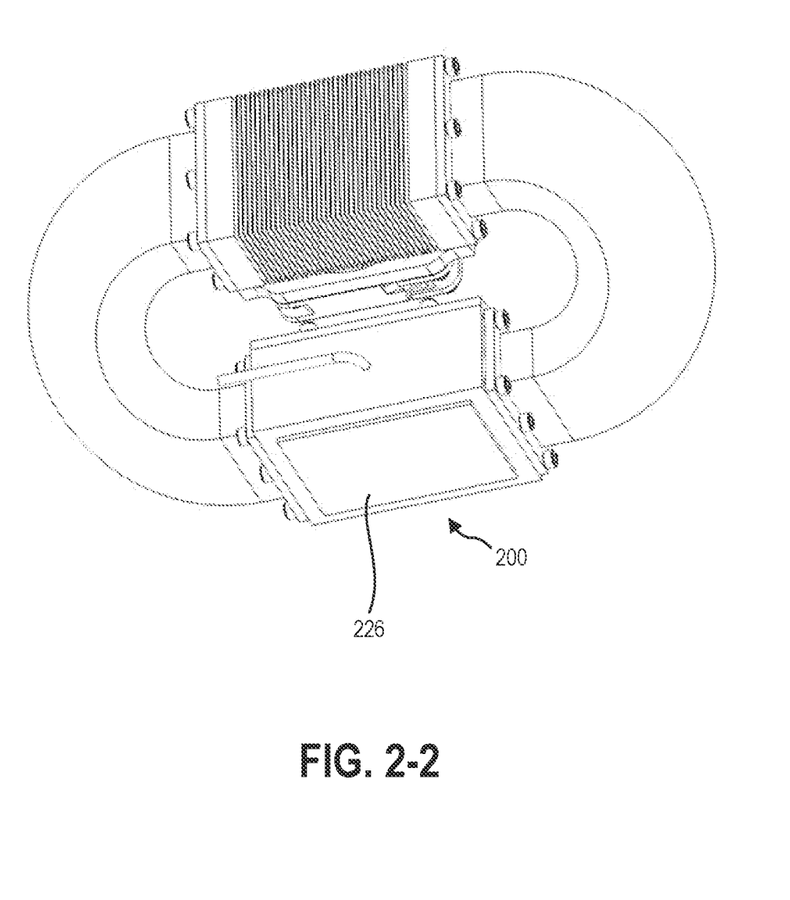

In some embodiments, a thermal interface is positioned proximate to and/or integrated with the magnetic pump 200. FIG. 2-2 is a bottom perspective view of the embodiment of a thermal management device 218 of FIG. 2-1. In some embodiments, the magnetic pump 200 includes a thermal interface 226 on at least one surface of the magnetic pump 200. In the embodiment illustrated in FIG. 2-2, the thermal interface 226 is located opposite the magnet of the magnetic pump 200. In some embodiments, the thermal interface 226 is located elsewhere in the magnetic pump 200, such as adjacent the magnet or adjacent an electrode. In some embodiments, the thermal interface 226 includes a thermal interface material that provides thermal conductivity between a heat-generating component and the electrically conductive working fluid in the magnetic pump 200.

Figure 23:
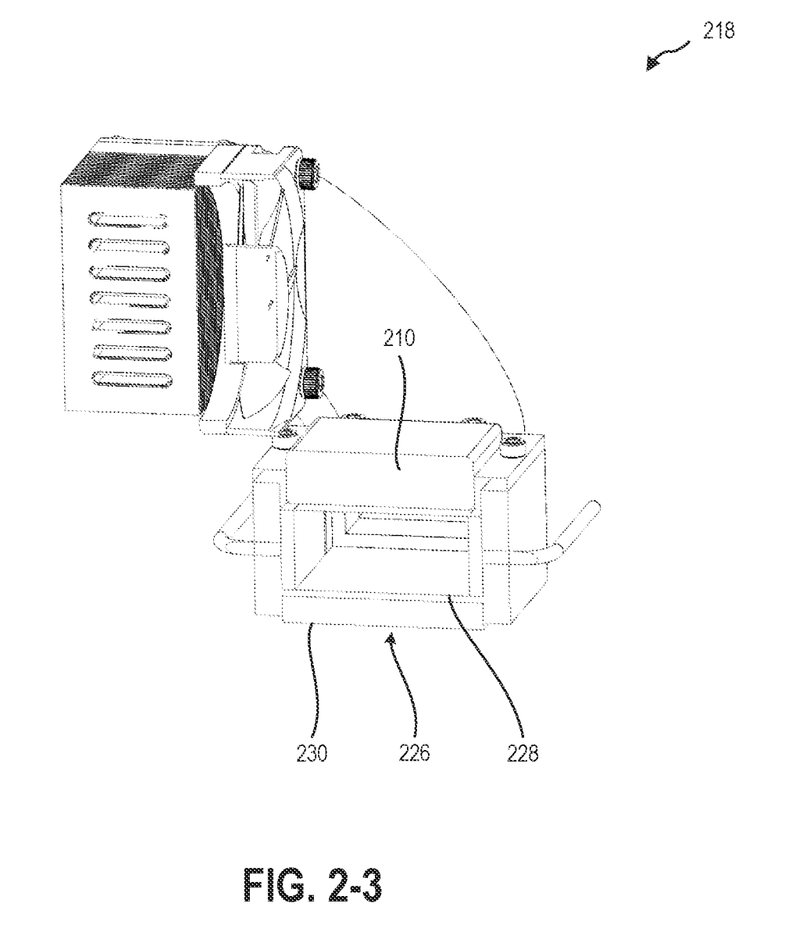
Figure 24:
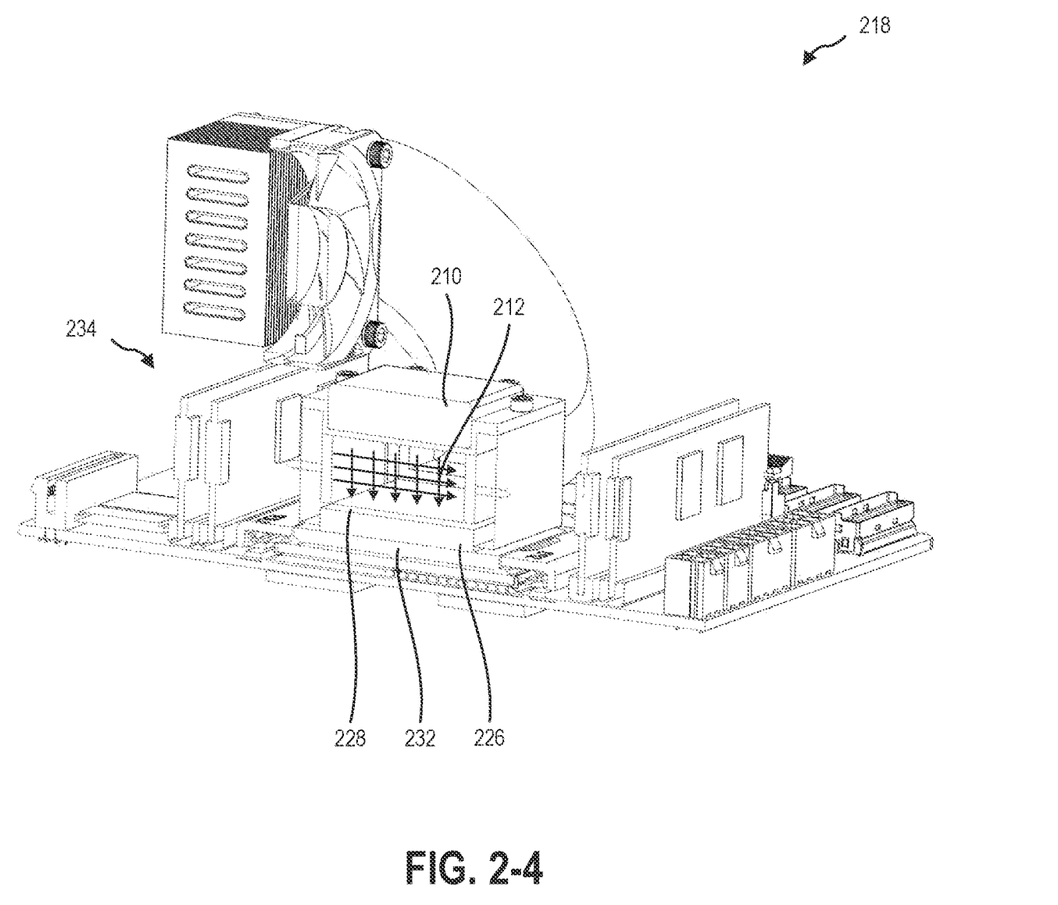

FIG. 2-3 is a cross-sectional view of the embodiment of a thermal management device 218 of FIG. 2-1. In some embodiments, the magnet 210 is located opposite the thermal interface 226. The thermal interface 226, in some embodiments, includes an electrically insulating material or other insulating layer 228 between the magnet 210 and a contact surface 230 of the thermal interface 226. FIG. 2-4 is a cross-sectional view of the embodiment of a thermal management device 218 of FIG. 2-1 in thermal communication with a processor 232 of a computing device 234. In at least one example, a heat-generating component, such as the processor 232 of FIG. 2-4, that contacts the thermal interface 226 to transfer heat to the thermal management device 218 is susceptible to and/or damaged by electric current 212 applied to its package. An electrically insulating layer 228 in the thermal interface 226 and/or adjacent to the thermal interface 226 to electrically insulate a heat-generating component from the electric current 212 may limit and/or prevent adverse effects.

In some embodiments, a heat-generating component is any electronic component or other component of a computing system that generates heat during operation. In some examples, the heat-generating component is or includes a processor 232, a hardware memory device, a network communication device, a power supply, or other electronic component.

Figure 3:
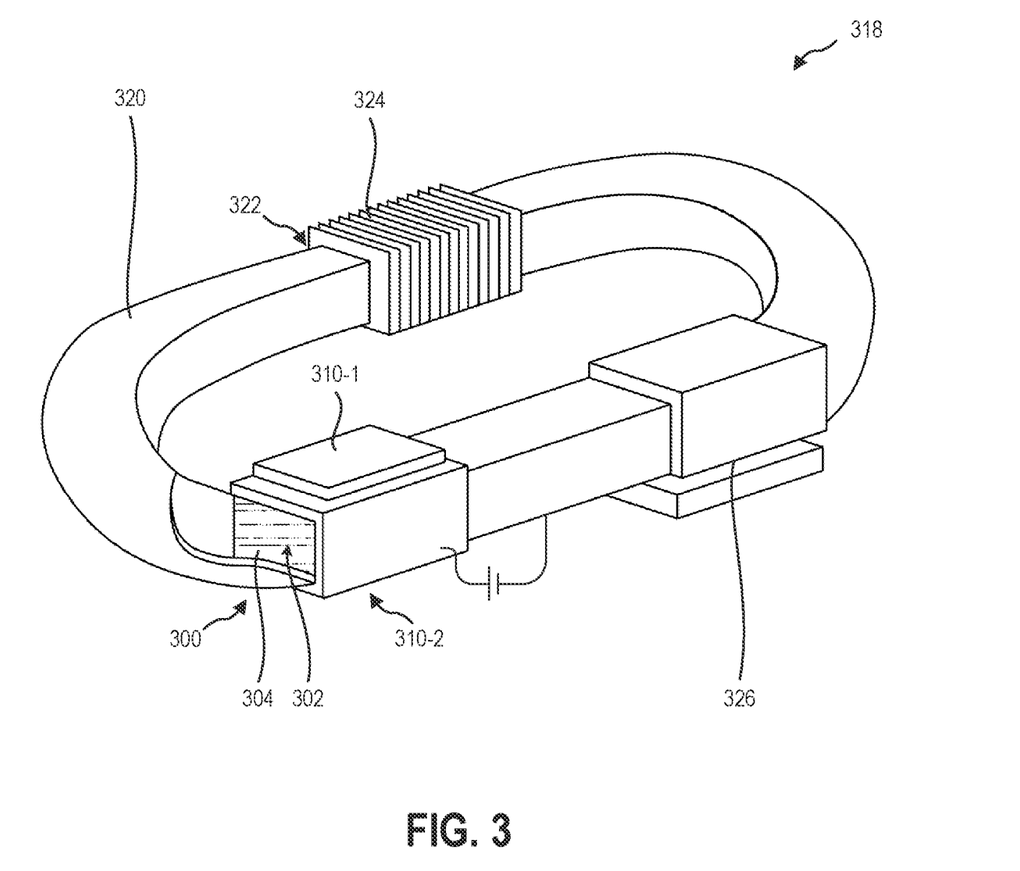
FIG. 3 is a perspective view of another thermal management device, according to at least some embodiments of the present disclosure.

FIG. 2-1 through 2-4 illustrate an embodiment of a thermal management device 218 with a magnetic pump 200 positioned proximate to and/or integrated with the thermal interface 226. In some embodiments, the magnetic pump is located away from the thermal interface. For example, the magnetic field of the magnetic pump is positioned away from the heat-generating component. FIG. 3 is a perspective view of a thermal management device 318 with a separate magnetic pump 300 and thermal interface 326 according to some embodiments of the present disclosure. In some embodiments, the magnetic pump 300 in a thermal management device 318 that is separate from the thermal interface 326 is or includes at least some elements of any embodiments of a magnetic pump described in relation to FIG. 1 through FIG. 2-4. In at least one embodiment, a magnetic pump 300 includes a first magnet 310-1 and a second magnet 310-2 positioned on opposite sides of the pumping region 302 to provide a magnetic field in the pumping region 302. In some embodiments, the first magnet 310-1 and second magnet 310-2 are or include permanent magnets. In some embodiments, the first magnet 310-1 and second magnet 310-2 are or include electromagnets. In some embodiments, the first magnet 310-1 is or includes a permanent magnet, and the second magnet 310-2 is or includes an electromagnet. In some embodiments, at least one of the first magnet 310-1 and second magnet 310-2 include a plurality of magnets.

The magnetic pump 300, in some embodiments, pumps the electrically conductive working fluid 304 away from the thermal interface 326. For example, the magnetic pump 300 flows hot electrically conductive working fluid 304 away from the thermal interface 326. In some embodiments, the magnetic pump 300 flows cool electrically conductive working fluid 304 toward a thermal interface 326. In some embodiments, the magnetic pump 300 flows hot electrically conductive working fluid 304 toward a heat exchanger 322. In some embodiments, the magnetic pump 300 flows cool electrically conductive working fluid 304 away from a heat exchanger 322. In some embodiments, the heat exchanger 322 exhausts heat from the electrically conductive working fluid 304. In an example, the heat exchanger 322 has a plurality of fins 324, rods, pins, etc., to increase surface area of the heat exchanger 322 and exhaust heat received from the electrically conductive working fluid 304. In some embodiments, the electrically conductive working fluid 304 exhausts heat to the surrounding atmosphere. In some embodiments, as will describe in more detail herein, the electrically conductive working fluid 304 exhausts heat to an immersion working fluid. In some embodiments, the magnetic pump 300 flows the electrically conductive working fluid 304 in a continuous loop fluid conduit 320 that includes the thermal interface 326. In some embodiments, the magnetic pump 300 flows the electrically conductive working fluid 304 in a continuous loop fluid conduit 320 that includes the heat exchanger 322. In at least one embodiment, the continuous loop fluid conduit 320 is a sealed fluid conduit.

Figure 4:
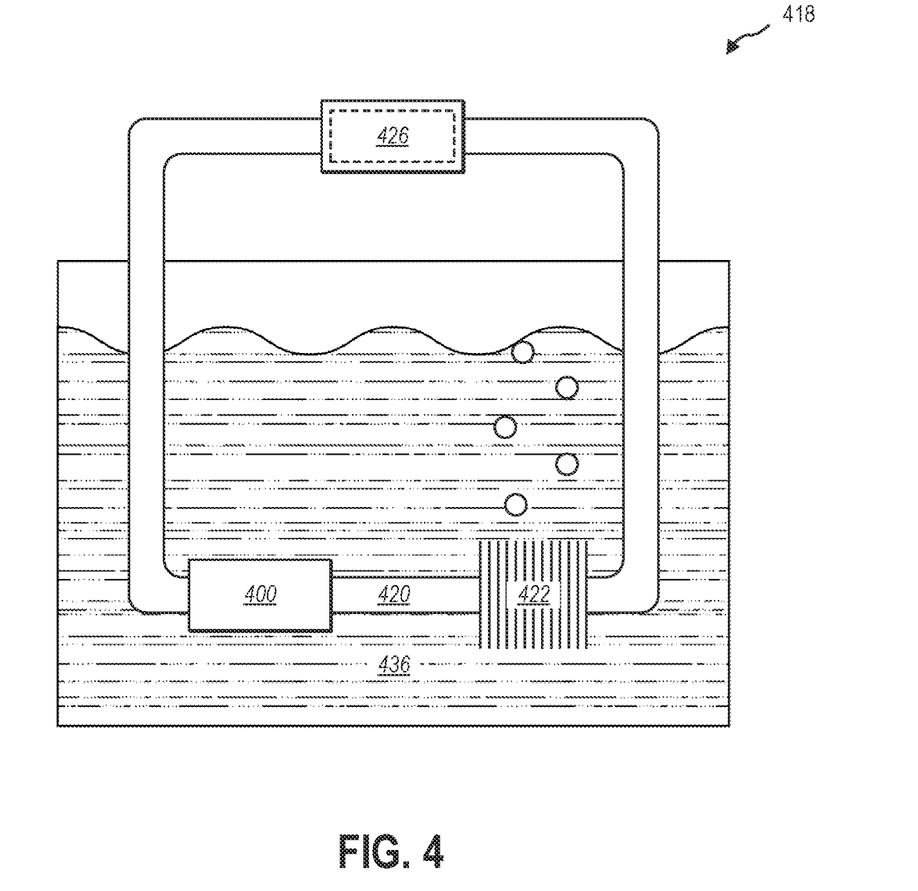
FIG. 4 is a schematic view of an immersion cooled thermal management device, according to at least some embodiments of the present disclosure.

FIG. 4 is a side view of an immersion cooled thermal management device 418 according to some embodiments of the present disclosure. In some embodiments, the immersion cooled thermal management device 418 is or includes elements of any embodiment of a thermal management device 418 described in relation to FIG. 1 through FIG. 3. In some embodiments, the heat exchanger 422 and/or at least a portion of the fluid conduit 420 is immersed in an immersion working fluid 436. The immersion working fluid 436 receives heat from the fluid conduit 420, from the heat exchanger 422, from other components of the thermal management device 418, or combinations thereof. In some embodiments, the magnetic pump 400 is immersed in the immersion working fluid 436. In some embodiments, the thermal interface 426 is immersed in the immersion working fluid 436. In at least one embodiment, the thermal management device 418 is entirely immersed in the immersion working fluid 436. In some embodiments, the immersion working fluid 436 receives heat from the thermal management device 418 and increases in temperature. In some embodiments, the immersion working fluid 436 receives heat from the thermal management device and vaporizes without a substantial change in temperature. In at least one embodiment, the heat exchanger 422 of the thermal management device 418 is immersed in immersion working fluid 436 while the thermal interface 426 and any heat-generating component connected thereto remains outside of the immersion working fluid 436.

Figure 5:
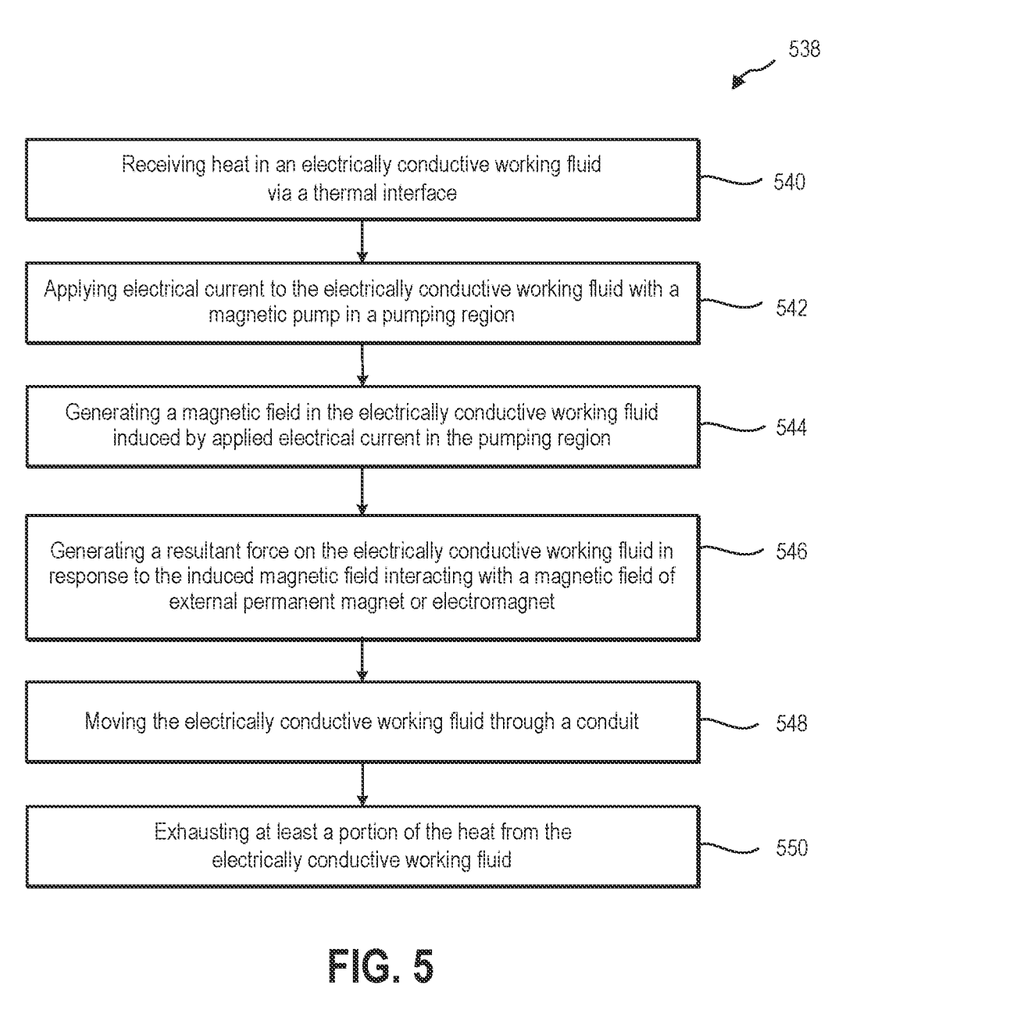
FIG. 5 is a flowchart illustrating a method of thermal management, according to at least some embodiments of the present disclosure.

FIG. 5 is a flowchart illustrating a method 538 of thermal management according to some embodiments of the present disclosure. In some embodiments, the method 538 includes using a thermal management device according to any embodiment or embodiment including elements described in relation to FIG. 1 through 4. In some embodiments, the method 538 includes receiving heat in an electrically conductive working fluid via a thermal interface at 540. The electrically conductive working fluid is, in some embodiments, any of the electrically conductive working fluids described herein. In some embodiments, the method 538 further includes applying electrical current to the electrically conductive working fluid with a magnetic pump in a pumping region at 542 and generating a magnetic field in the electrically conductive working fluid induced by the applied electrical current in the pumping region at 544.

The magnetic field is applied by one or more magnets proximate to the pumping region, such as described in relation to FIG. 1. The electrical current is induced by a pair of electrodes proximate the pumping region, such as described in relation to FIG. 1. In some embodiments, two or more pairs of electrodes are used. In some embodiments, the method includes generating a resultant force on the electrically conductive working fluid in response to the induced magnetic field interacting with a magnetic field of external permanent magnet or electromagnet, such as the Lorentz force described in relation to FIG. 1, at 546. The resultant force moves the electrically conductive working fluid through a conduit at 548. In some embodiments, the conduit is a sealed conduit. In some embodiments, the conduit is an unsealed conduit. In some embodiments, the conduit directs the electrically conductive working fluid away from the thermal interface. In some embodiments, the conduit directs the electrically conductive working fluid toward the thermal interface. In some embodiments, the conduit directs the electrically conductive working fluid toward a heat exchanger. In some embodiments, the conduit directs the electrically conductive working fluid away from a heat exchanger. In some embodiments, the conduit is a continuous loop.

In some embodiments, the method 538 further includes exhausting at least a portion of the heat from the electrically conductive working fluid at 550. In some embodiments, the heat is exhausted by a heat exchanger, such as the heat exchanger described in relation to FIG. 1. In some embodiments, the heat is exhausted to the surrounding atmosphere. In some embodiments, the heat is exhausted to a liquid working fluid, such as an immersion working fluid.

In some embodiments, the magnitude of the resultant force on the electrically conductive working fluid is adjusted by a controller. In some embodiments, the controller adjusts a magnitude of the electrical current induced by the electrodes by adjusting a voltage applied thereto. In some embodiments, the controller adjusts a magnitude of the magnetic field by adjusting a current to an electromagnet of the magnetic pump. In some embodiments, the controller adjusts the magnitude of the resultant force at least partially based on a measurement from a sensor.

Figure 6:
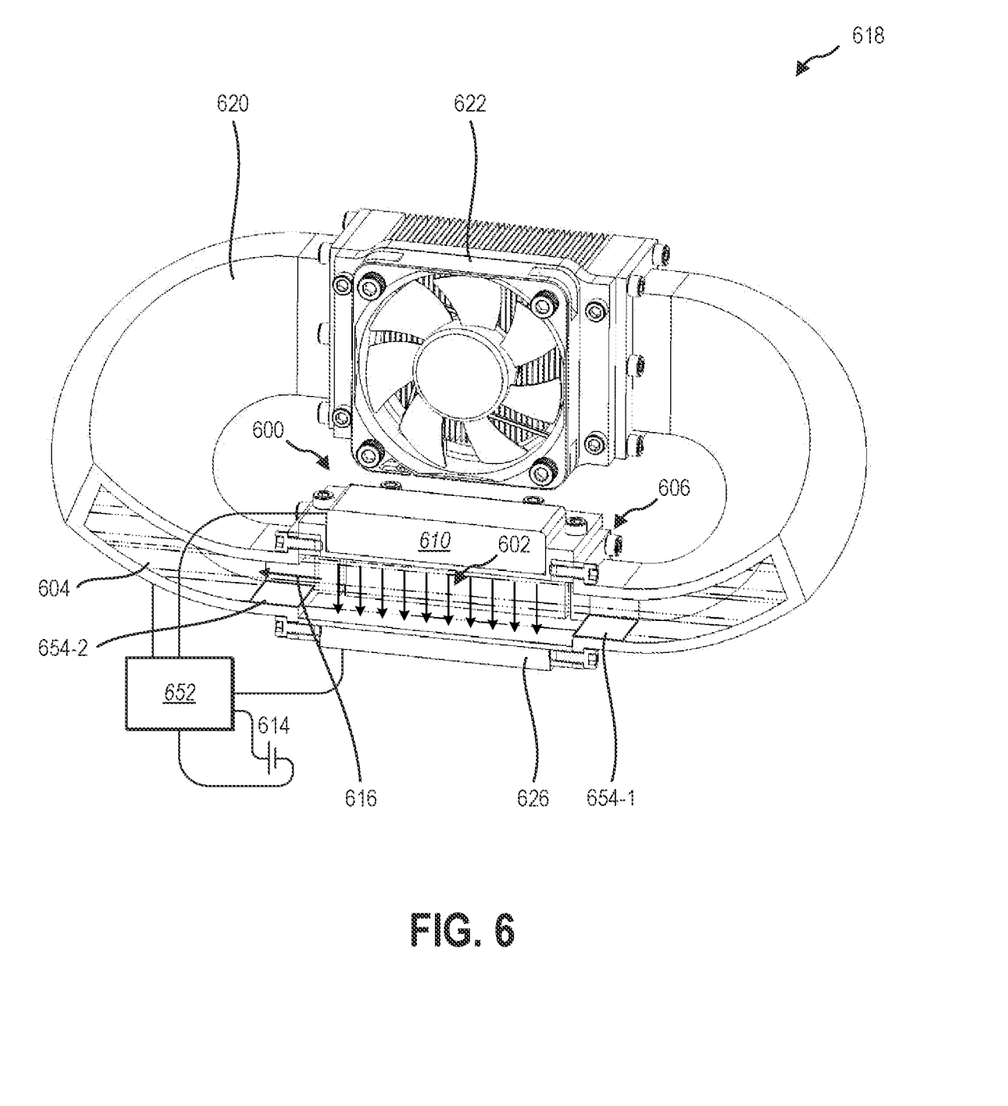
FIG. 6 is a perspective view of a thermal management device including a controller to adjust a force, according to at least some embodiments of the present disclosure.

FIG. 6 is a system diagram of a thermal management device 618 including a controller 652 that changes the magnitude of the resultant force 616, such as described in relation to FIG. 5. In some embodiments, the thermal management device 618 includes a magnetic pump 600, thermal interface 626, fluid conduit 620, heat exchanger 622, and combinations thereof according to any embodiments described in relation to FIG. 1 through FIG. 4. In some embodiments, the controller 652 is in electrical communication with a magnet 610 (e.g., an electromagnet) and/or a pair of electrodes 606 of the magnetic pump 600. In some embodiments, the controller 652 receives electrical power from the voltage source 614 or other electrical power source and transmits a portion of the electrical power to the magnet(s) 610 and/or pair(s) of electrodes 606 of the magnetic pump 600.

In some embodiments, the controller 652 adjusts the electrical power provided to the magnet(s) 610 and/or pair(s) of electrodes 606 of the magnetic pump 600 based at least partially on a sensor measurement received from one or more sensors 654-1, 654-2. In some embodiments, the sensor 654-1, 654-2 is a magnetic field sensor. In some embodiments, the sensor 654-1, 654-2 is a temperature sensor. In some examples, the temperature sensor is positioned to measure a temperature of the thermal interface 626. In some examples, the temperature sensor is positioned to measure a temperature of the electrically conductive working fluid 604. In some examples, the temperature sensor is positioned to measure a temperature of the heat exchanger 622. In some examples, the temperature sensor is positioned to measure a temperature of a heat-generating component in contact with the thermal interface 626. In some embodiments, the sensor 654-1, 654-2 is a flowrate sensor. In some examples, the flowrate sensor is positioned to measure a flowrate of the electrically conductive working fluid 604 in the pumping region 602. In some examples, the flowrate sensor is positioned to measure a flowrate of the electrically conductive working fluid 604 in the fluid conduit 620. In some examples, the flowrate sensor is positioned to measure a flowrate of the electrically conductive working fluid 604 in the heat exchanger 622.

INDUSTRIAL APPLICABILITY

The present disclosure relates generally to the thermal management of heat-generating components. More particularly, the present disclosure relates to the thermal management of heat-generating components with a magnetohydrodynamic pumping mechanism. In some embodiments, a thermal management device includes an electrically conductive working fluid that receives heat from a heat-generating component through a thermal interface and a magnetic pump urges the electrically conductive working fluid away from the thermal interface. In some embodiments, the electrically conductive working fluid flows through a conduit away from the thermal interface to exhaust at least a portion of the heat. In some embodiments, the electrically conductive working fluid flows through a closed-loop conduit away from the thermal interface to exhaust at least a portion of the heat before returning to the thermal interface to receive heat again. In some embodiments, the electrically conductive working fluid flows through a closed-loop conduit away from the thermal interface to exhaust at least a portion of the heat at a heat exchanger before returning to the thermal interface to receive heat again.

In some embodiments, the magnetic pump includes a magnet and a pair of electrodes. The pair of electrodes are in electrical communication with a portion of the electrically conductive working fluid to induce an electrical current through the electrically conductive working fluid between the first electrode and the second electrode of the pair of electrodes. In some embodiments, an external magnetic field in the electrically conductive working fluid is induced by the magnet of the magnet pump. The flow of electrical current between the first electrode and the second electrode in the presence of an external magnetic field generates a resultant Lorentz force perpendicular to both the direction of the magnetic field and the direction of the electrical current. The resultant force urges the portion of the electrically conductive working fluid with the electrical current therein to flow in the direction of the resultant force away from the magnetic pump. In some embodiments, the resultant force urges a hot electrically conductive working fluid to flow away from a thermal interface. In some embodiments, the resultant force urges a cool electrically conductive working fluid to flow toward a thermal interface. In some embodiments, the resultant force urges the electrically conductive working fluid to flow through a conduit of the thermal management device.

A thermal management device including a magnetic pump, according to some embodiments of the present disclosure, includes a sealed conduit or volume in which the electrically conductive working fluid flows. A sealed conduit or volume has substantially continuous inner surface with no seals, bearings, openings or gaps during operation that can allow for ingress of contaminants or egress of the electrically conductive working fluid during operation. For example, a sealed conduit may have a removable cap or opening that allows the conduit or volume to be filled with electrically conductive working fluid, but the cap or opening remains closed during operation. Because there is no mechanical pumping of the electrically conductive working fluid, no shaft, arm, lever, or other mechanical linkage need pass through the inner surface of the conduit or volume and potentially allow for failure of a seal. The operational lifetime of a thermal management device, according to some embodiments of the present disclosure, may be longer than that of a mechanically pumped working fluid.

A magnetic pump, in some embodiments, includes a pumping region in which the electrically conductive working fluid is positioned. A first electrode and a second electrode are positioned on opposite sides of the pumping region. The first electrode and the second electrode, when an electrical potential is applied thereto, generates an electrical current through the electrically conductive working fluid positioned in the pumping region between the electrodes.

In some embodiments, the magnetic pump includes a magnet positioned proximate to the pumping region and oriented to apply a magnetic field to the pumping region. In some embodiments, the magnet is positioned proximate to the pumping region and oriented to apply a magnetic flux substantially perpendicular to the direction of the electrical current. In some embodiments, the magnet is positioned proximate to the pumping region and oriented to apply a component of the magnetic flux perpendicular to the direction of the electrical current.

In some embodiments, the magnet of the magnetic pump is a permanent magnet. In some embodiments, the magnet of the magnetic pump is an electromagnet. In some embodiments, the magnet of the magnetic pump includes both a permanent magnet and an electromagnet. In some embodiments, the magnet of the magnetic pump includes a plurality of magnets, such as a plurality of permanent magnets, a plurality of electromagnets, or a combination of at least one permanent magnet and at least one electromagnet. In some embodiments, electromagnets are cooled passively or using an external cooling system. In some embodiments, electromagnets are cooled using the working fluid from within the magnetic pump.

The electrodes are connected to a voltage or current source to provide an electrical voltage or electrical current across the pumping region between the first electrode and the second electrode. In at least one embodiment, the voltage or current source provides a variable electrical voltage and/or current to the pair of electrodes to vary the magnitude of the electrical current induced in the electrically conductive working fluid in the pumping region. In some embodiments, the voltage or current source is further connected to the magnet(s) of the magnetic pump to provide an electrical current to an electromagnet.

The electrically conductive working fluid in the pumping region allows the electrical current to flow between the first electrode and the second electrode. In some embodiments, the electrically conductive working fluid has a resistivity of no greater than $10^{-6}$ Ohm×m.

In some embodiments, the electrically conductive working fluid is or includes a metal phase that is liquid at the operating temperatures of the thermal management device. For example, the electrically conductive working fluid has a melting temperature no more than 30° C. In some embodiments, the electrically conductive working fluid has a melting temperature no more than 10° C. In some embodiments, the electrically conductive working fluid has a melting temperature of no more than 0° C.

In some embodiments, the electrically conductive working fluid is or includes gallium, such as elemental gallium or alloys including gallium. In at least one embodiment, the electrically conductive working fluid is or includes gallium indium tin (known as Galinstan). In some examples, gallium indium tin has a melting temperature of approximately −2° C. In some examples, eutectic composition of gallium indium tin has a melting temperature of approximately 11° C. In some embodiments, the electrically conductive working fluid is or includes mercury, such as elemental mercury or alloys including mercury. In some embodiments, mercury has a melting temperature of approximately −39° C.

While some embodiments include a metal fluid, in some embodiments, the electrically conductive working fluid is a non-metal fluid. For example, the electrically conductive working fluid may include a non-metal fluid with ions allowing the non-metal fluid to conduct electricity. In some embodiments, the electrically conductive working fluid is or includes a liquid electrolyte. In some embodiments, the electrically conductive working fluid is or includes water with ions and/or electrolytes in solution in the water. In some embodiments, the electrically conductive working fluid is or includes an ionized gas.

In some embodiments, the electrically conductive working fluid is substantially uniform, such as a liquid metal electrically conductive working fluid, an electrolytic aqueous electrically conductive working fluid, or an ionized gas electrically conductive working fluid. In some embodiments, the electrically conductive working fluid is a multiphase working fluid including a liquid phase and a particulate phase in suspension in the liquid phase. In some embodiments, the particulate phase is electrically conductive and allows the electrical current to flow through the electrically conductive working fluid by flowing through the particulate phase. In an example, the electrically conductive working fluid includes iron or electrically conductive iron alloy particles in a particulate phase suspended in a non-electrically conductive oil liquid phase (e.g., ferrofluid). In some embodiments, the liquid phase is electrically conductive. In an example, the electrically conductive working fluid includes non-electrically conductive particles in a particulate phase suspended in an electrically conductive liquid phase. The particulate phase may have a higher thermal capacity and/or thermal mass than the liquid phase, allowing the electrically conductive working fluid to receive more heat, while the electrically conductive liquid phase conducts the electrical current. In some embodiments, both the particulate phase and the liquid phase are electrically conductive. In an example, the electrically conductive working fluid includes iron or electrically conductive iron alloy particles in a particulate phase suspended in a non-electrically conductive oil liquid phase.

In some embodiments, the electrically conductive working fluid is a single physical phase working fluid. In such embodiments, the electrically conductive working fluid remains in a liquid phase throughout the operation of the thermal management device. In some embodiments, the electrically conductive working fluid is a two physical phase working fluid. In such embodiments, at least a portion of the electrically conductive working fluid vaporizes and condenses during operation of the thermal management device.

In some embodiments, a thermal management device includes a magnetic pump, such as any of the embodiments described herein and/or any other elements of magnetic pumps described herein. In some embodiments, the magnetic pump is in fluid communication with a fluid conduit that flows the electrically conductive working fluid away from the magnetic pump and/or toward the magnetic pump. In some embodiments, the fluid conduit is a sealed fluid conduit. A sealed conduit or volume has substantially continuous inner surface with no seals, bearings, openings, or gaps during operation that can allow for ingress of contaminants or egress of the electrically conductive working fluid during operation. For example, a sealed conduit may have a removable cap or opening that allows the conduit or volume to be filled with electrically conductive working fluid, but the cap or opening remains closed during operation. In some embodiments, the fluid conduit is an unsealed fluid conduit.

In some embodiments, the fluid conduit flows the electrically conductive working fluid from the magnetic pump to a heat exchanger. The heat exchanger exhausts heat from the electrically conductive working fluid. In an example, the heat exchanger has a plurality of fins, rods, pins, etc., to increase surface area of the heat exchanger and exhaust heat received from the electrically conductive working fluid. In some embodiments, the electrically conductive working fluid exhausts heat to the surrounding atmosphere. In some embodiments, as will describe in more detail herein, the electrically conductive working fluid exhausts heat to an immersion working fluid.

In some embodiments, the magnetic pump is in electrical communication with a voltage or current source, such as described herein. In some embodiments, the voltage or current source provides electrical power to the electrodes of the magnetic pump. In some embodiments, the voltage or current source provides electrical power to an electromagnet of the magnetic pump.

In some embodiments, a thermal interface is positioned proximate to and/or integrated with the magnetic pump. In some embodiments, the magnetic pump includes a thermal interface on at least one surface of the magnetic pump. In some embodiments, the thermal interface is located opposite the magnet of the magnetic pump. In some embodiments, the thermal interface is located elsewhere in the magnetic pump, such as adjacent the magnet or adjacent an electrode. In some embodiments, the thermal interface includes a thermal interface material that provides thermal conductivity between a heat-generating component and the electrically conductive working fluid in the magnetic pump.

In some embodiments, a magnet is located opposite the thermal interface. The thermal interface, in some embodiments, includes an electrically insulating material or other insulating layer between the magnet and a contact surface of the thermal interface. In at least one example, a heat-generating component, such as a processor, that contacts the thermal interface to transfer heat to the thermal management device is susceptible to and/or damaged by electric current. An electrically insulating layer in the thermal interface and/or adjacent to the thermal interface to electrically insulate a heat-generating component from the electric current may limit and/or prevent adverse effects.

In some embodiments, a heat-generating component is any electronic component or other component of a computing system that generates heat during operation. In some examples, the heat-generating component is or includes a processor, a hardware memory device, a network communication device, a power supply, or other electronic component.

In some embodiments of a thermal management device, a magnetic pump positioned proximate to and/or integrated with the thermal interface. In some embodiments, the magnetic pump is located away from the thermal interface. For example, the magnetic field of the magnetic pump is positioned away from the heat-generating component. In some embodiments, the magnetic pump in a thermal management device that is separate from the thermal interface is or includes at least some elements of any embodiments of a magnetic pump described herein. In at least one embodiment, a magnetic pump includes a first magnet and a second magnet positioned on opposite sides of the pumping region to provide a magnetic field in the pumping region. In some embodiments, the first magnet and second magnet are or include permanent magnets. In some embodiments, the first magnet and second magnet are or include electromagnets. In some embodiments, the first magnet is or includes a permanent magnet, and the second magnet is or includes an electromagnet. In some embodiments, at least one of the first magnet and the second magnet include a plurality of magnets.

The magnetic pump, in some embodiments, pumps the electrically conductive working fluid away from the thermal interface. For example, the magnetic pump flows hot electrically conductive working fluid away from the thermal interface. In some embodiments, the magnetic pump flows cool electrically conductive working fluid toward a thermal interface. In some embodiments, the magnetic pump flows hot electrically conductive working fluid toward a heat exchanger. In some embodiments, the magnetic pump flows cool electrically conductive working fluid away from a heat exchanger. In some embodiments, the heat exchanger exhausts heat from the electrically conductive working fluid. In an example, the heat exchanger has a plurality of fins, rods, pins, etc., to increase surface area of the heat exchanger and exhaust heat received from the electrically conductive working fluid. In some embodiments, the electrically conductive working fluid exhausts heat to the surrounding atmosphere. In some embodiments, as will describe in more detail herein, the electrically conductive working fluid exhausts heat to an immersion working fluid. In some embodiments, the magnetic pump flows the electrically conductive working fluid in a continuous loop fluid conduit that includes the thermal interface. In some embodiments, the magnetic pump flows the electrically conductive working fluid in a continuous loop fluid conduit that includes the heat exchanger. In at least one embodiment, the continuous loop fluid conduit is a sealed fluid conduit.

In some embodiments, the heat exchanger and/or at least a portion of the fluid conduit is immersed in an immersion working fluid. The immersion working fluid receives heat from the fluid conduit, from the heat exchanger, from other components of the thermal management device, or combinations thereof. In some embodiments, the magnetic pump is immersed in the immersion working fluid. In some embodiments, the thermal interface is immersed in the immersion working fluid. In at least one embodiment, the thermal management device is entirely immersed in the immersion working fluid. In some embodiments, the immersion working fluid receives heat from the thermal management device and increases in temperature. In some embodiments, the immersion working fluid receives heat from the thermal management device and vaporizes without a substantial change in temperature. In at least one embodiment, the heat exchanger of the thermal management device is immersed in immersion working fluid while the thermal interface and any heat-generating component connected thereto remains outside of the immersion working fluid.

In some embodiments, a method of thermal management includes using a thermal management device according to any embodiment or embodiment including elements described herein. In some embodiments, the method includes receiving heat in an electrically conductive working fluid via a thermal interface. The electrically conductive working fluid is, in some embodiments, any of the electrically conductive working fluids described herein. In some embodiments, the method further includes applying electrical current to the electrically conductive working fluid with a magnetic pump in a pumping region and generating a magnetic field in the electrically conductive working fluid induced by the applied electrical current in the pumping region.

The magnetic field is applied by one or more magnets proximate to the pumping region, such as described herein. The electrical current is induced by a pair of electrodes proximate the pumping region, such as described herein. In some embodiments, two or more pairs of electrodes are used. In some embodiments, the method includes generating a resultant force on the electrically conductive working fluid in response to the induced magnetic field interacting with a magnetic field of external permanent magnet or electromagnet, such as the Lorentz force described herein. The resultant force moves the electrically conductive working fluid through a conduit. In some embodiments, the conduit is a sealed conduit. In some embodiments, the conduit is an unsealed conduit. In some embodiments, the conduit directs the electrically conductive working fluid away from the thermal interface. In some embodiments, the conduit directs the electrically conductive working fluid toward the thermal interface. In some embodiments, the conduit directs the electrically conductive working fluid toward a heat exchanger. In some embodiments, the conduit directs the electrically conductive working fluid away from a heat exchanger. In some embodiments, the conduit is a continuous loop.

In some embodiments, the method further includes exhausting at least a portion of the heat from the electrically conductive working fluid. In some embodiments, the heat is exhausted by a heat exchanger, such as the heat exchanger described herein. In some embodiments, the heat is exhausted to the surrounding atmosphere. In some embodiments, the heat is exhausted to a liquid working fluid, such as an immersion working fluid.

In some embodiments, the magnitude of the resultant force on the electrically conductive working fluid is adjusted by a controller. In some embodiments, the controller adjusts a magnitude of the electrical current induced by the electrodes by adjusting a voltage applied thereto. In some embodiments, the controller adjusts a magnitude of the magnetic field by adjusting a current to an electromagnet of the magnetic pump. In some embodiments, the controller adjusts the magnitude of the resultant force at least partially based on a measurement from a sensor.

In some embodiments, the thermal management device includes a magnetic pump, thermal interface, fluid conduit, heat exchanger, and combinations thereof according to any embodiments described herein. In some embodiments, a controller is in electrical communication with an electromagnet and/or a pair of electrodes of the magnetic pump. In some embodiments, the controller receives electrical power from the voltage source or other electrical power source and transmits a portion of the electrical power to the electromagnet(s) and/or pair(s) of electrodes of the magnetic pump.

In some embodiments, the controller adjusts the electrical power provided to the electromagnet(s) and/or pair(s) of electrodes of the magnetic pump based at least partially on a sensor measurement received from one or more sensors. In some embodiments, the sensor is a magnetic field sensor. In some embodiments, the sensor is a temperature sensor. In some examples, the temperature sensor is positioned to measure a temperature of the thermal interface. In some examples, the temperature sensor is positioned to measure a temperature of the electrically conductive working fluid. In some examples, the temperature sensor is positioned to measure a temperature of the heat exchanger. In some examples, the temperature sensor is positioned to measure a temperature of a heat-generating component in contact with the thermal interface. In some embodiments, the sensor is a flowrate sensor. In some examples, the flowrate sensor is positioned to measure a flowrate of the electrically conductive working fluid in the pumping region. In some examples, the flowrate sensor is positioned to measure a flowrate of the electrically conductive working fluid in the fluid conduit. In some examples, the flowrate sensor is positioned to measure a flowrate of the electrically conductive working fluid in the heat exchanger.

The present disclosure relates to systems and methods for thermal management in a computing system according to at least the examples provided in the clauses below:

Clause 1. A system for thermal management, the system comprising: a thermal interface configured to receive heat from a heat-generating electronic component; an electrically conductive working fluid in contact with the thermal interface to receive heat from the thermal interface; a magnetic pump configured to apply a magnetic field and an electrical current to the electrically conductive working fluid; and a heat exchanger in thermal communication with the electrically conductive working fluid to exhaust heat from the electrically conductive working fluid.

Clause 2. The system of clause 1, wherein the magnetic pump includes a plurality of magnets.

Clause 3. The system of clause 1 or 2, wherein the electrically conductive working fluid is a single phase working fluid.

Clause 4. The system of clause 1 or 2, wherein the electrically conductive working fluid includes a fluid phase and an electrically conductive particulate suspended in the fluid phase.

Clause 5. The system of clause 4, wherein the fluid phase is electrically conductive.

Clause 6. The system of any preceding clause, wherein the magnetic pump is located outside a sealed fluid volume and the electrically conductive working fluid is located in the sealed fluid volume.

Clause 7. The system of any preceding clause, wherein the magnetic pump is located proximate the heat exchanger.

Clause 8. The system of clause 1 or 2, wherein the electrically conductive working fluid is a ferromagnetic fluid.

Clause 9. The system of any preceding clause, wherein the magnetic pump includes a permanent magnet and a pair of electrodes.

Clause 10. The system of any preceding clause, wherein the magnetic pump includes an electromagnet.

Clause 11. The system of any preceding clause, wherein the electrically conductive working fluid has a resistivity no greater than 10−6 Ohm×m.

Clause 12. The system of clause 1 or 2, wherein the electrically conductive working fluid is an ionized gas.

Clause 13. The system of any preceding clause, wherein the heat exchanger exhausts heat to an immersion working fluid.

Clause 14. The system of clause 13, wherein the magnetic pump is immersed in the immersion working fluid.

Clause 15. A method of thermal management, the method comprising: receiving heat in an electrically conductive working fluid via a thermal interface; applying an electrical current to the electrically conductive working fluid with a magnetic pump in a pumping region; generating a magnetic field in the electrically conductive working fluid induced by applied electrical current in the pumping region; generating a resultant force on the electrically conductive working fluid in response to the induced magnetic field interacting with a magnetic field of external permanent magnet or electromagnet; moving the electrically conductive working fluid through a conduit; and exhausting at least a portion of the heat from the electrically conductive working fluid.

Clause 16. The method of clause 15, further comprising changing a magnitude of the resultant force based at least partially on a temperature measurement of the thermal interface.

Clause 17. The method of clause 16, wherein changing the magnitude of the resultant force includes changing a magnitude of the magnetic field.

Clause 18. The method of clause 16, wherein changing the magnitude of the resultant force includes changing an amperage of the electrical current.

Clause 19. The method of any of clauses 15-18, further comprising flowing the electrically conductive working fluid to a heat exchanger to exhaust at least a portion of the heat.

Clause 20. A system for thermal management, the system comprising: a thermal interface configured to receive heat from a heat-generating electronic component; an electrically conductive working fluid in contact with the thermal interface to receive heat from the thermal interface; a magnetic pump configured to apply a magnetic field to the electrically conductive working fluid and an electrical current in the electrically conductive working fluid; a heat exchanger to exhaust heat from the electrically conductive working fluid to an immersion cooling fluid; and a fluid conduit providing fluid communication for the electrically conductive working fluid from the thermal interface to the heat exchanger.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A system for thermal management, the system comprising:
    a fluid conduit including a pumping region;
    a thermal interface located at a first longitudinal position on the fluid conduit and configured to receive heat from a heat-generating electronic component;
    an electrically conductive working fluid in the fluid conduit and in contact with the thermal interface to receive heat from the thermal interface;
    a magnetic pump located at a second longitudinal position on the fluid conduit longitudinally displaced from the first longitudinal position and configured to apply a magnetic field and an electrical current to the electrically conductive working fluid, wherein the magnetic field is applied to the electrically conductive working fluid in the pumping region by a first magnet and a second magnet opposite the first magnet across the pumping region therebetween; and
    a heat exchanger located at a third longitudinal position on the fluid conduit different from the first longitudinal position and the second longitudinal position and in thermal communication with the electrically conductive working fluid to exhaust heat from the electrically conductive working fluid.

2. The system of claim 1, wherein at least one of the first magnet and the second magnet of the magnetic pump are an electromagnetic.

3. The system of claim 1, wherein the electrically conductive working fluid is a single phase working fluid.

4. The system of claim 1, wherein the electrically conductive working fluid includes a fluid phase and an electrically conductive particulate suspended in the fluid phase.

5. The system of claim 4, wherein the fluid phase is electrically conductive.

6. The system of claim 1, wherein the magnetic pump is located outside a sealed fluid volume and the electrically conductive working fluid is located in the sealed fluid volume.

7. The system of claim 1, wherein the magnetic pump is located proximate the heat exchanger.

8. The system of claim 1, wherein the electrically conductive working fluid is a ferromagnetic fluid.

9. The system of claim 1, wherein the magnetic pump includes a permanent magnet and a pair of electrodes.

10. The system of claim 1, wherein the magnetic pump is positioned in an upstream direction between the thermal interface and the heat exchanger.

11. The system of claim 1, wherein the electrically conductive working fluid has a resistivity no greater than $10^{-6}$ Ohm×m.

12. The system of claim 1, wherein the electrically conductive working fluid is an ionized gas.

13. The system of claim 1, wherein the heat exchanger exhausts heat to an immersion working fluid.

14. The system of claim 13, wherein the magnetic pump is immersed in the immersion working fluid.

15. The system of claim 1, wherein the magnetic pump is located in an upstream direction between the thermal interface and the heat exchanger.

* * * * *